United States Patent
Watkins et al.

(10) Patent No.: US 7,046,005 B2
(45) Date of Patent: May 16, 2006

(54) METHOD AND APPARATUS FOR DRIVER CIRCUITS FOR USE IN MAGNETIC SYSTEMS

(75) Inventors: Ronald Dean Watkins, Niskayuna, NY (US); Douglas Arthur Kelley, Rockville, MD (US); Joseph Edward Piel, Jr., Scotia, NY (US)

(73) Assignee: General Electric Company, Niskayuna, NY (US)

( * ) Notice: Subject to any disclaimer, the term of this patent is extended or adjusted under 35 U.S.C. 154(b) by 72 days.

(21) Appl. No.: 10/742,982

(22) Filed: Dec. 22, 2003

(65) Prior Publication Data
US 2005/0134265 A1    Jun. 23, 2005

(51) Int. Cl.
*G01V 3/00* (2006.01)

(52) U.S. Cl. .................... 324/309; 324/322

(58) Field of Classification Search ........... 324/307, 324/309, 322
See application file for complete search history.

(56) References Cited

U.S. PATENT DOCUMENTS

| | | | |
|---|---|---|---|
| 2,814,784 A | 11/1957 | Riblet | |
| 2,975,381 A | 3/1961 | Reed et al. | |
| 3,030,501 A | 4/1962 | Rapuano | |
| 5,235,282 A * | 8/1993 | Overweg et al. | 324/318 |
| 5,446,464 A | 8/1995 | Feldle | 342/175 |
| 5,565,779 A * | 10/1996 | Arakawa et al. | 324/318 |
| 5,638,001 A * | 6/1997 | Vrijheid et al. | 324/318 |
| 5,869,966 A * | 2/1999 | Gatehouse | 324/322 |
| 6,198,287 B1 * | 3/2001 | Heiserholt et al. | 324/322 |
| 6,236,205 B1 * | 5/2001 | Ludeke et al. | 324/318 |
| 6,400,155 B1 * | 6/2002 | Kormos et al. | 324/318 |
| 6,483,306 B1 * | 11/2002 | Hahn | 324/307 |
| 6,593,744 B1 * | 7/2003 | Burl et al. | 324/322 |
| 6,748,749 B1 * | 6/2004 | Tsuda | 62/49.2 |
| 6,799,366 B1 * | 10/2004 | Tsuda | 29/607 |

* cited by examiner

*Primary Examiner*—Diego Gutierrez
*Assistant Examiner*—Dixomara Vargas
(74) *Attorney, Agent, or Firm*—Jean K. Testa; Christian G. Cabou

(57) ABSTRACT

A control system comprising a driver circuit for magnetic systems is provided. The driver circuit is coupled to a magnetic system and is configured for isolating control signals from electromagnetic interference. The control signals are configured for controlling a plurality of switching elements in the magnetic system. The driver circuit and the magnetic system are located in shielded environment.

14 Claims, 3 Drawing Sheets

METHOD AND APPARATUS FOR DRIVER CIRCUITS FOR USE IN MAGNETIC SYSTEMS

BACKGROUND OF THE INVENTION

The invention relates generally to driver circuits, and more specifically to driver circuits implemented in magnetic systems.

High field magnetic systems like magnetic resonance imaging (MRI) systems, are typically located outside a shielded room. The switching elements of the magnetic systems are controlled by driver circuits generally located outside the shielded room. Typically, cables are used to connect the driver circuits to the switching elements in the magnetic system.

Isolating the signals propagated through the cables from outside to the inside of the shielded room is a major challenge in such applications. Typically, radio frequency interference is carried into the shielded room by cables that are used to control the switching elements. Such cables can also conduct noise from outside the shielded room to inside the room to very sensitive antennas and preamplifier circuits.

Preventing crosstalk between several signal channels present inside the shielded room is yet another challenge in such applications. Radio frequency interference is typically conducted from one signal channel to another signal channel within the shielded room which is undesirable.

It would therefore be desirable to design a system to isolate the interference caused by signals propagated by the driver circuit located outside the shielded room to the switching elements present inside the shielded room. In addition, it is also desirable to reduce the interference between the signal channels of the switching elements located within the shielded room.

BRIEF DESCRIPTION OF THE INVENTION

Briefly, in accordance with one embodiment of the invention a control system for use in a magnetic system is provided. The control system comprises a driver circuit coupled to the magnetic system and configured for isolating control signals from electromagnetic interference. The control signals are configured for controlling a plurality of switching elements in the magnetic system, and the driver circuit and the magnetic system are located in shielded environment.

According to another aspect of the invention, a method for isolating control signals from electromagnetic interference is provided. The method comprises controlling a plurality of switching elements in a magnetic system using control signals generated outside a shielded environment. The magnetic system is located inside the shielded environment and the control signals are propagated to the shielded environment via optical fibers.

In another embodiment, a control system for a magnetic resonance imaging (MRI) system is provided. The control system comprises a driver circuit coupled to the MRI system and configured for isolating control signals from electromagnetic interference. The control signals are configured for controlling a plurality of switching elements in the MRI system. The driver circuit and the NRI system are located in shielded environment.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
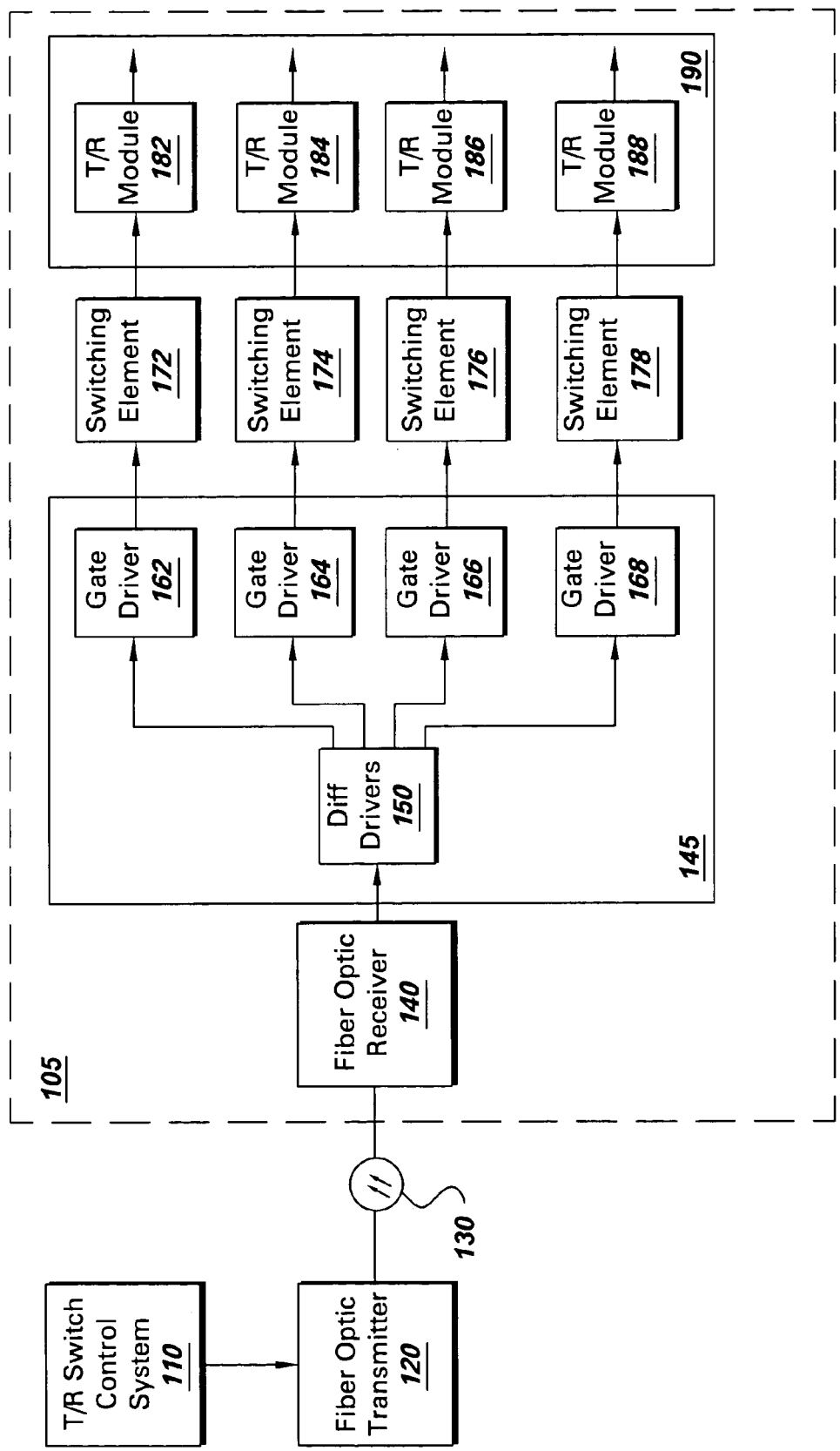
FIG. 1 is a block diagram of an embodiment of a control system implemented in accordance with one aspect of the present invention.

FIG. 1 is a block diagram of an embodiment of control system 100 implemented according to one aspect of the invention. The control system 100 comprises driver circuit 145. The driver circuit is configured for controlling transmit/receive (T/R) modules 182, 184, 186 and 188 of magnetic system 190. The magnetic system is located within a shielded environment such as shielded room 105. In an embodiment, the driver circuit is implemented for magnetic systems operating at high frequencies and high magnetic fields. In one embodiment, the operating frequency is at least 1 MHz and the magnetic field strength is at least 1.5 Tesla. Each component of FIG. 1 is described in further detail below.

As used herein, "adapted to", "configured" and the like refer to mechanical or structural connections between elements to allow the elements to cooperate to provide a described effect; these terms also refer to operation capabilities of electrical elements such as analog or digital computers or application specific devices (such as an application specific integrated circuit (ASIC)) that are programmed to perform a sequel to provide an output in response to given input signals.

Transmit receive (T/R) switch control system 110 is configured to transmit control signals to driver circuit 145. The driver circuit is configured for controlling switching elements 172, 174, 176 and 178 respectively. As illustrated in FIG. 1, the T/R switch control system is located outside shielded room 105 and the driver circuit is located inside shielded room 105. The driver circuit is coupled to the magnetic system 190 via the switching elements.

Driver circuit 145 is configured for receiving control signals from T/R switch control system 110. The control signals are transmitted to the driver circuit by fiber optic transmitter 120. The fiber optic transmitter converts the control signals, which are usually an electrical analog or digital signal, into a corresponding optical signal. The source of the optical signal can be a light emitting diode, a solid state laser diode, etc.

The optical signals are propagated to the shielded environment using optical fiber 130. Optical fibers usually comprise of one or more glass fibers, which act as waveguides for the optical signal. Fiber optic receiver 140 is configured for receiving the control signals inside the shielded room. Fiber optic receiver is configured for converting the optical signal back to the electrical signal representative of the control signal. The detector of the optical signal is either a PIN-type photodiode or avalanche-type photodiode.

Driver circuit 145 comprises gate drivers 162, 164, 166 and 168. The driver circuit further comprises a differential driver circuit 150 coupled to each one of the gate drivers.

The differential driver circuit is configured for providing switching signals to the gate drivers.

Each one of gate drivers 162, 164, 166 and 168 are coupled to switching elements 172, 174, 176 and 178 respectively via channels. In the illustrated embodiment, the channels are implemented using optical isolators such as optical fibers. By using optical isolators, interference between the channels is minimized.

The gate drivers are configured for providing switching signals to the corresponding switching element. Switching elements 172, 174, 176 and 178 are in turn coupled to T/R modules 182, 184, 186 and 188 respectively of the magnetic system 190. In one embodiment, the switching elements comprise power MOSFETs. In a further embodiment, the magnetic system is a magnetic resonance imaging system. In a further specific embodiment, the driver circuit is located within an imaging volume of the magnetic resonance imaging system.

Figure 2:
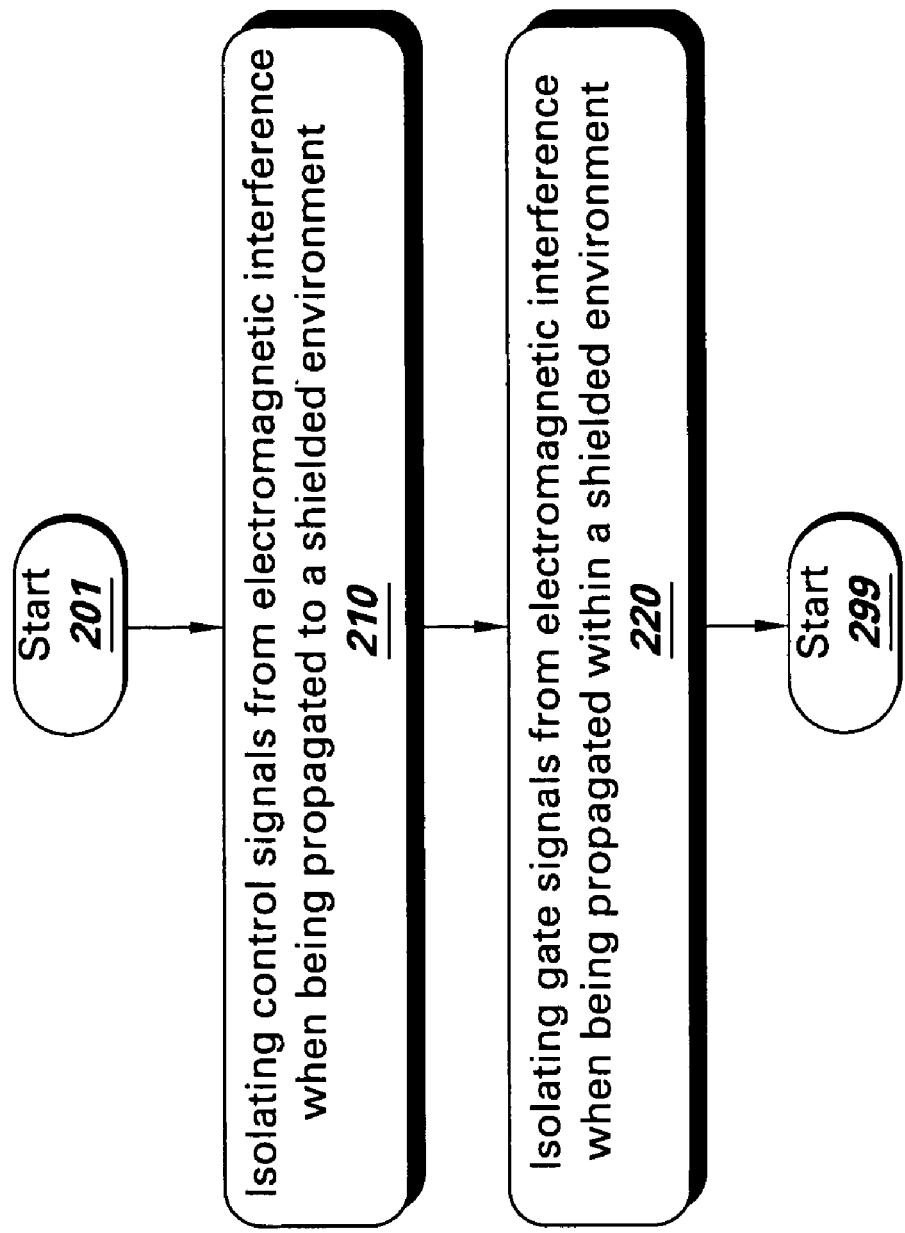
FIG. 2 is a flow chart illustrating a method for isolating control signals from electromagnetic interference in high magnetic field environment.

FIG. 2 is a flow chart illustrating a method for isolating control signals from electromagnetic interference in high magnetic field environment. In step 210, control signals are isolated from electromagnetic interference when propagated into a shielded environment. The control signals are used for controlling a plurality of switching elements present in a magnetic system. The magnetic system is located inside the shielded environment and the control signals are propagated to the shielded environment via optical fibers. By transmitting the control signals using optical fibers, electromagnetic interference between the control signals is minimized.

In step 220, a plurality of gate signals are isolated from electromagnetic interference by using optical isolators such as optical fibers. The gate driver signals are propagated within the shielded environment and are prone to interference due to the high magnetic field present within the shielded environment. In one embodiment, the magnetic field strength is at least 1.5 Tesla. By using optical fibers, the interference is minimized. In one embodiment, the magnetic system comprises a magnetic resonance imaging system.

Figure 3:
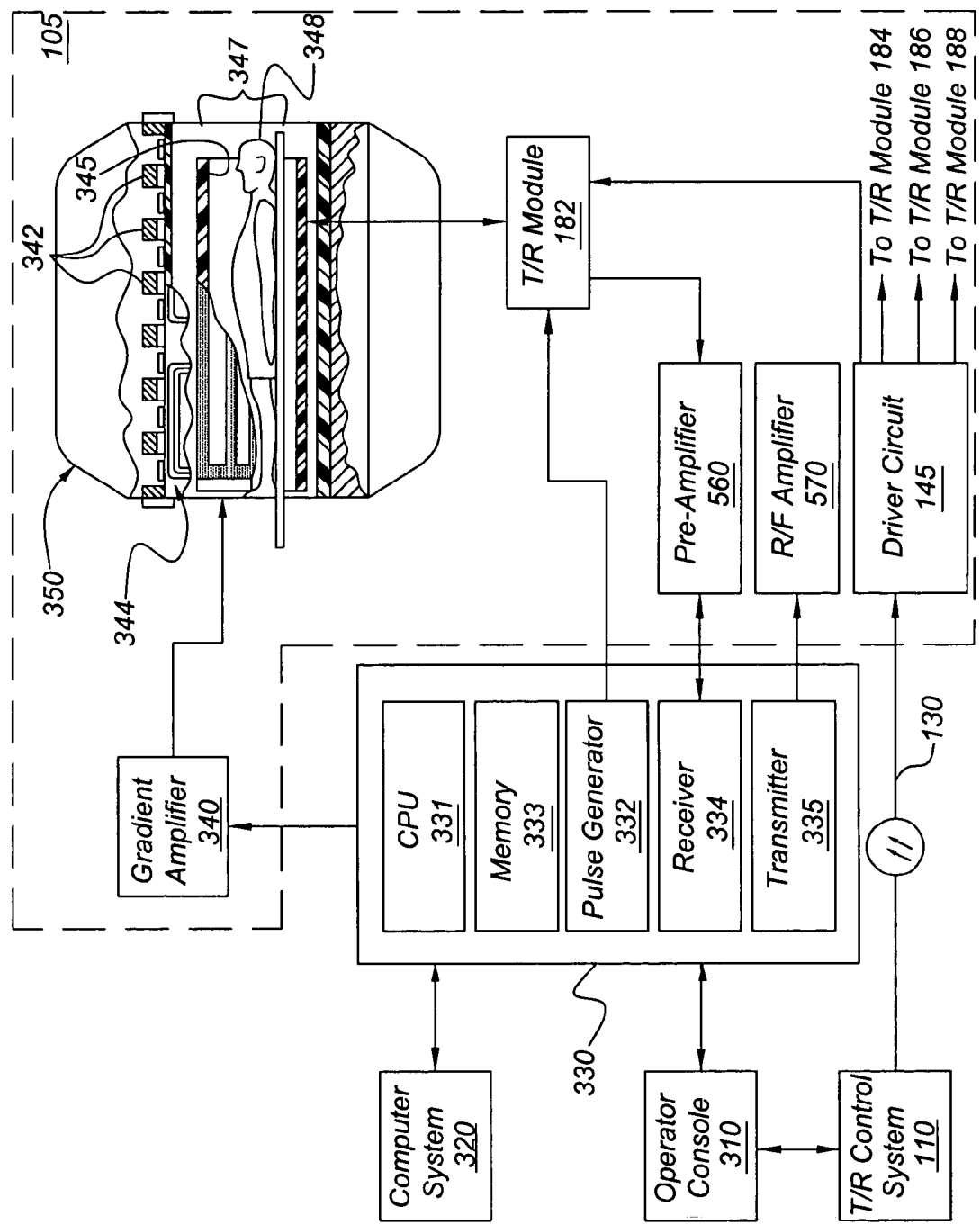
FIG. 3 is a block diagram of an embodiment of a high field magnetic resonance imaging (MRI) system implemented according to an aspect of the invention.

FIG. 3 illustrates a simplified block diagram of a system for producing images to which embodiments of the driver circuit of the present invention are applicable. In the illustrated embodiment of FIG. 3, the system is a MR imaging system which incorporates the present invention. The MRI system could be, for example, a GE-Signa MR scanner available from GE Medical Systems, Inc., which is adapted to perform the method of the present invention, although other systems could be used as well.

The operation of the MR system is controlled from an operator console 310, which includes a keyboard and control panel and a display (not shown). The console 310 communicates with a separate computer system 320 that enables an operator to control the production and display of images. The computer system 320 includes a number of modules, which communicate with each other through a backplane. These include an image processor module, a CPU module, and a memory module, known in the art as a frame buffer for storing image data arrays. The computer system 320 is linked to a disk storage and a tape drive for storage of image data and programs, and it communicates with a separate system control 330 through a high speed serial link.

The system control 330 includes a set of modules connected together by a backplane. These include a CPU module 331 and a pulse generator module 332, which connects to the operator console 310 through a serial link. The system control 330 receives commands from the operator, which indicate the scan sequence that is to be performed. The pulse generator module 332 operates the system components to carry out the desired scan sequence. It produces data that indicate the timing, strength, and shape of the radio frequency (RF) pulses which are to be produced, and the timing of and length of the data acquisition window. The pulse generator module 332 connects to a set of gradient amplifiers 340 to indicate the timing and shape of the gradient pulses to be produced during the scan.

The gradient waveforms produced by the pulse generator module 332 are applied to a gradient amplifier system 340 comprising of $G_x$, $G_y$ and $G_z$ amplifiers (not shown). Each gradient amplifier excites a corresponding gradient coil in an assembly generally designated 344 to produce the magnetic field gradients used for position encoding acquired signals. The gradient coil assembly 344 forms part of a magnet assembly 350 which includes a polarizing magnet 342 and a whole-body RF coil 345. Volume 347 is shown as the area within magnet assembly 350 for receiving subject 348 and includes a patient bore. As used herein, the usable volume of a MRI scanner is defined generally as the volume within volume 347 that is a contiguous area inside the patient bore where homogeneity of main, gradient and RF fields are within known, acceptable ranges for imaging.

Transmitter module 335 in the system control 330 produces pulses that are amplified by an RF amplifier 370 and coupled to the RF coil 345 by a transmit/receive switch 142. The resulting signals radiated by the excited nuclei in the subject 348 may be sensed by the same RF coil 345 and coupled through the transmit/receive switch 142 to a preamplifier 360. The amplified MR signals are demodulated, filtered, and digitized in receiver 334. The transmit/receive switch 182, is controlled by a signal from the pulse generator module 332 to electrically couple the transmitter 335 to the coil 345 during the transmit mode and to connect the preamplifier 360 to the RF coil during the receive mode.

The MR signals picked up by the RF coil 345 are digitized by the receiver module 335 and transferred to a memory module 333 in the system control 330. When the scan is completed and an entire array of data has been acquired in the memory module 333. An array processor (not shown) operates to Fourier transform the data into an array of image data. These image data are conveyed to the computer system 320 where they are stored. In response to commands received from the operator console 310, these image data may be further processed by an image processor within computer system 320 and conveyed to the operator console 310 and subsequently displayed.

Driver circuit 145 is coupled to the T/R module 142 as shown in the FIG. 3. The driver circuit provides control signals for the T/R module via switching elements (not shown). The control signals are propagated from the T/R control system to the driver circuit via optical fibers. The advantages of using optical fibers include high immunity to electromagnetic interference and low attenuation of signals. Thus, by transmitting the control signals to the shielded environment using optical fibers, electromagnetic interference between the control signals is minimized.

As illustrated in FIG. 3, gradient amplifier 340, the magnet assembly 350, T/R module 182, pre-amplifier 360, amplifier 350 and driver circuit 145 are located within shielded room 105. The driver circuit receives signals from the T/R control system 110 via optical fibers 130. The T/R control system 110 is located outside the shielded room 105.

As used herein, the term "very high field" refers to magnetic fields produced by the MRI system that are greater than about 2 Tesla. For embodiments of the invention the high field is desirably 3 Tesla. Also, as used herein, with reference to high field MRI systems, "very high frequency"

is considered to be the range of about 64 MHz to about 300 MHz, with a desired range between about 128 MHz and 300 MHz. For embodiments of the invention, the high frequency is desirably at about 128 MHz. Imaging at very high fields and very high frequencies is particularly useful for cardiac, spine and extremity imaging.

The previously described embodiments of the invention have many advantages, including isolating control signals from electromagnetic interference when being propagated into a high field magnetic environment. Further, the invention also isolates control signals from electromagnetic interference and cross talk between channels present within the shielded environment.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A control system for use in a magnetic system, the control system comprising:
   a driver circuit coupled to the magnetic system and configured for isolating control signals from electromagnetic interference, wherein the driver circuit comprises a plurality of gate drivers coupled to a corresponding switching element via channels, the gate drivers configured to generate a plurality of gate signals, each gate signal being transmitted to a corresponding switching element via a respective channel, and wherein the gate signals are isolated from electromagnetic interference;
   wherein the control signals are configured for controlling a plurality of switching elements in the magnetic system, and wherein the driver circuit and the magnetic system are located in shielded environment.

2. The control system of claim 1, further comprising a switch control system located outside the shielded environment, wherein the switch control system is configured for controlling the driver circuit, wherein the switch control system is coupled to the driver circuit using optical fibers.

3. The control system of claim 1, wherein the channels comprise optical fibers.

4. The control system of claim 3, wherein the driver circuit further comprises a differential driver circuit coupled to each one of the plurality of gate drivers, the differential driver circuit configured for providing a current to the gate drivers.

5. The control system of claim 1, wherein the magnetic system comprises a magnetic resonance imaging system.

6. The control system of claim 5, wherein the driver circuit is located within an imaging volume of the magnetic resonance imaging system.

7. A method for isolating control signals from electromagnetic interference, the method comprising:
   controlling a plurality of switching elements in a magnetic system using control signals generated outside a shielded environment using a driver circuit, wherein the magnetic system and the driver circuit is located inside the shielded environment, wherein the control signals are propagated to the shielded environment via optical fibers; and
   isolating a plurality of gate signals from electromagnetic interference using optical isolators, wherein the gate driver signals are propagated within the shielded environment.

8. The method of claim 7, wherein the magnetic system comprises a magnetic resonance imaging system.

9. The method of claim 8, wherein the driver circuit is located within an imaging volume of the magnetic resonance imaging system.

10. A control system for use in magnetic resonance imaging (MRI) system, the control system comprising:
    a driver circuit coupled to the MRI system and configured for isolating control signals from electromagnetic interference, wherein the driver circuit comprises a plurality of gate drivers coupled to a corresponding switching element via channels, the gate drivers configured to generate a plurality of gate signals, each gate signal being transmitted to a corresponding switching element via a respective channel, and wherein the gate signals are isolated from electromagnetic interference;
    wherein the control signals are configured for controlling a plurality of switching elements in the MRI system, and wherein the driver circuit and the MRI system are located in shielded environment.

11. The control system of claim 10, further comprising a switch control system located outside the shielded environment, wherein the switch control system is configured for controlling the driver circuit, wherein the switch control system is coupled to the driver circuit using optical fibers.

12. The control system of claim 10, wherein the channels comprise optical fibers.

13. The control system of claim 12, wherein the driver circuit further comprises a differential driver circuit coupled to each one of the plurality of gate drivers, the differential driver circuit configured for providing a current to the gate drivers.

14. The control system of claim 10, wherein the driver circuit is located within an imaging volume of the magnetic resonance imaging system.

* * * * *